United States Patent
Cho et al.

(10) Patent No.: US 7,304,885 B2
(45) Date of Patent: Dec. 4, 2007

(54) PHASE CHANGE MEMORIES AND/OR METHODS OF PROGRAMMING PHASE CHANGE MEMORIES USING SEQUENTIAL RESET CONTROL

(75) Inventors: Beak-Hyung Cho, Gyeonggi-do (KR); Du-Eung Kim, Gyeonggi-do (KR); Woo-Yeong Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 59 days.

(21) Appl. No.: 11/074,557

(22) Filed: Mar. 8, 2005

(65) Prior Publication Data

US 2006/0007729 A1    Jan. 12, 2006

(30) Foreign Application Priority Data

Jul. 9, 2004    (KR) .................. 10-2004-0053346

(51) Int. Cl.
*G11C 11/00*    (2006.01)
(52) U.S. Cl. .............. 365/163; 365/148; 365/189.01; 365/194
(58) Field of Classification Search .............. 365/163, 365/148, 194, 189.01
See application file for complete search history.

(56) References Cited

U.S. PATENT DOCUMENTS

| | | | |
|---|---|---|---|
| 3,922,648 A * | 11/1975 | Buckley | 365/163 |
| 6,075,719 A | 6/2000 | Lowrey et al. | 365/148 |
| 6,480,438 B1 | 11/2002 | Park | |
| 6,487,113 B1 * | 11/2002 | Park et al. | 365/163 |
| 6,545,907 B1 | 4/2003 | Lowrey et al. | 365/163 |
| 6,707,712 B2 * | 3/2004 | Lowery | 365/175 |
| 6,839,270 B2 * | 1/2005 | Perner et al. | 365/158 |
| 7,075,841 B2 * | 7/2006 | Resta et al. | 365/203 |
| 2004/0022085 A1 | 2/2004 | Parkinson et al. | |

* cited by examiner

*Primary Examiner*—David Lam
(74) *Attorney, Agent, or Firm*—Myers Bigel Sibley & Sajovec

(57) ABSTRACT

Phase-change memory devices are provided that include a plurality of phase-change memory cells and a reset pulse generation circuit configured to output a plurality of sequential reset pulses. Each sequential reset pulse is output to a corresponding one of a plurality of reset lines. A plurality of write driver circuits are coupled to corresponding phase change memory cells and to a corresponding one of the reset lines of the reset pulse generation circuit. Methods of programming phase-change memory devices using sequential reset control signals are also provided.

31 Claims, 10 Drawing Sheets

PHASE CHANGE MEMORIES AND/OR METHODS OF PROGRAMMING PHASE CHANGE MEMORIES USING SEQUENTIAL RESET CONTROL

RELATED APPLICATIONS AND CLAIM OF PRIORITY

This application is related to and claims priority from Korean Patent Application No. 2004-0053346, filed on Jul. 9, 2004, in the Korean Intellectual Property Office, the disclosure of which is incorporated by reference herein in its entirety.

FIELD OF THE INVENTION

The present invention relates to driver circuits and the control of driver circuits for memory elements, and more particularly, to driver circuits and/or methods for phase change memory elements.

BACKGROUND OF THE INVENTION

A phase change memory element is a memory element for storing information using the characteristics of electric conductivity or a resistance difference between a crystalline phase and an amorphous phase of a specific phase change material. The phase change memory element forms a memory cell electrically connected to a transistor element or the like, formed on a semiconductor substrate for addressing and read/write operations of the device. In the memory element, information is stored using a conductivity difference in accordance with the phase change of a region of a memory layer.

FIG. 1A and FIG. 1B illustrate a conventional phase change memory cell 10. As seen in FIG. 1A, the phase change memory cell 10 includes a phase change material 14 between top electrode 12 and a bottom electrode 18. To increase the current density and, thereby, improve the efficiency of heating of the phase change material 14, the bottom electrode 18 may be connected to the phase change material 14 through a bottom electrode contact (BEC) 16 that has reduced surface area in comparison to the bottom electrode 18. An access transistor 20 may be connected to the bottom electrode 18 and controlled by a word line.

As seen in FIGS. 1A, 1B and 2, the phase change memory cell 10 operates such that a current flowing through the phase change material 14 electrically heats a phase change region, and the structure of the phase change material 14 is reversibly changed to a crystalline state (FIG. 1A) or an amorphous state (FIG. 1B) to store information. In FIG. 1B, the region of the phase change material 14 that changes state to an amorphous state is illustrated by the cross-hatched region adjacent the BEC 16. The stored information can be read by flowing a relatively low current through the phase change region and measuring the resistance of the phase change material. Thus, FIG. 2 illustrates a conventional phase change memory cell 10 where a cell transistor 20 is controlled by a word line WL to control the flow of current ICELL from a bit line BL through the variable resistance C provided by the phase change material.

In setting the region of the phase change material 14 to an amorphous state or a crystalline state, different pulses may be used to control the heating of the phase change material 14. As seen in FIG. 3, a high temperature short duration heating cycle 35 is used to reset the phase change material 14 to an amorphous state and a longer duration lower temperature heating cycle 36 is used to set the phase change material 14 to a crystalline state. In particular, in the short duration cycle 35, the phase change material 14 is heated to a temperature above the melting point, Tm, of the phase change material 14 and then quickly cooled, e.g., within a few nanoseconds, to create an amorphous region in the phase change material 14. In the longer duration cycle 36, the phase change material 14 is heated to a temperature above a crystallizing point, Tx, and below the melting point, Tm, of the phase change material 14 and maintained at that temperature for a predetermined time before cooling to create a crystallized region in the phase change material 14. Thus, the temperature is maintained within a set window of above the crystallizing temperature Tx and below the melting temperature Tm.

FIG. 4 illustrates various current waveforms for programming phase-change memories. In particular, as seen in FIG. 4, the reset current is of shorter duration but greater amplitude than the set current. If multiple memory cells (e.g., more than 16 bits) are reset simultaneously, the peak current may exceed the capability of the power supply, which may result in fluctuations in the output of the power supply. Typically, the number of memory cells in a block of memory cells that are simultaneously programmed (set and reset) has been limited by the reset current considerations.

Various techniques for programming phase-change memory cells are described, for example, in U.S. Pat. Nos. 6,545,907; 6,075,719; and 6,487,113.

SUMMARY OF THE INVENTION

Some embodiments of the present invention provide phase-change memory devices that include a plurality of phase-change memory cells and a reset pulse generation circuit configured to output a plurality of sequential reset pulses. Each sequential reset pulse is output to a corresponding one of a plurality of reset lines. A plurality of write driver circuits are coupled to corresponding phase change memory cells and to a corresponding one of the reset lines of the reset pulse generation circuit.

In further embodiments, the reset pulse generation circuit includes a first pulse generation circuit configured to generate a first reset pulse and a plurality of delay lines serially coupled to the first pulse generation circuit to provide successive sequentially delayed reset pulses. The first pulse generation circuit may be responsive to an address transition detection signal to generate the first reset pulse. In other embodiments, the first pulse generation circuit is responsive to a data transition detection signal to generate the first reset pulse. The first pulse generation circuit may include a NAND logic gate having a first control signal as a first input and a delayed version of the first control signal as a second input. The first pulse generation circuit may further include a delay line that receives as an input the first control signal and outputs the delayed version of the first control signal to the second input of the NAND logic gate. Furthermore, a delay of each of the delay lines may be greater than a pulse width of the first reset pulse.

In additional embodiments of the present invention, the plurality of write driver circuits are each coupled to a plurality of bit lines of the phase-change memory cells. The plurality of bit lines may be from a same word of the phase-change memory device or from different words of the phase-change memory device.

In still further embodiments of the present invention, the plurality of write driver circuits are each coupled to a single bit line of the phase-change memory cells.

In some embodiments of the present invention, the duration of each of the plurality of sequential reset pulses may be less than the duration of a set pulse of the phase-change memory device. Furthermore, a set pulse of the phase-change memory device may have a duration of from about 100 to about 500 ns and each of the sequential reset pulses may have a duration of from about 10 to about 50 ns. The sequential reset pulses may be spaced apart from each other by about 10 ns.

Some embodiments of the present invention provide methods of programming a memory device comprising a plurality of phase-change memory cells by sequentially applying a reset pulse to subsets of the phase-change memory cells that are commonly connected to a word line. The plurality of phase-change memory cells are reset by applying a signal of a first pulse width to the phase-change memory cells and set by applying a signal of a second pulse width to the phase-change memory cells and wherein a duration of each of the sequentially applied reset pulses corresponds to the first pulse width and a sum of the durations of the sequentially applied reset pulses is not greater than the second pulse width. The subsets of the phase-change memory cells may be configured so that a different reset pulse is applied to each individual bit line of the memory device or so that a same reset pulse is applied to at least two different bit lines of the memory device. The two different bit lines may each be from different words of the memory device.

In still further embodiments of the present invention, the sequentially applied reset pulses are generated by respective write drivers responsive to corresponding reset control signals and each of the write drivers receives a same set control signal.

In particular embodiments of the present invention, the sequentially applied reset pulses are not overlapping. A set pulse of the phase-change memory device may have a duration of from about 100 to about 500 ns and each of the sequential reset pulses may have a duration of from about 10 to about 50 ns. The sequential reset pulses may be spaced apart from each other by about 10 ns.

Some embodiments of the present invention provide phase-change memory devices that include a plurality of phase-change memory cells and means for sequentially applying a reset pulse to subsets of the phase-change memory cells that are commonly connected to a word line. The plurality of phase-change memory cells may be reset by applying a signal of a first pulse width to the phase-change memory cells and set by applying a signal of a second pulse width to the phase-change memory cells. The means for sequentially applying a reset pulse may include means for sequentially applying a reset pulse wherein a duration of each of the sequentially applied reset pulses corresponds to the first pulse width and a sum of the durations of the sequentially applied reset pulses is not substantially greater than the second pulse width.

In additional embodiments of the present invention, the subsets of the phase-change memory cells are configured so that a different reset pulse is applied to each individual bit line of the memory device. In other embodiments of the present invention, the subsets of the phase-change memory cells are configured so that a same reset pulse is applied to at least two different bit lines of the memory device. The two different bit lines may each be from different words of the memory device.

Further embodiments of the present invention include means for applying a common set pulse to the subsets of the phase-change memory cells that are commonly connected to a word line.

Some embodiments of the present invention provide phase-change memory devices that include a plurality of phase-change memory cells and a plurality of write driver circuits coupled to the phase change memory cells. Each of the plurality of write driver circuits receives a different, non-overlapping, reset control signal. Each of the write driver circuits may also receive a same set control signal. In certain embodiments, a sum of durations of the different reset control signals is not greater than a duration of the set control signal.

Some embodiments of the present invention provide methods of controlling write driver circuits of a phase-change memory device by providing a different, non-overlapping, reset control signal to each of a plurality of write driver circuits of the phase-change memory device. A same set control signal may be provided to each of the plurality of write driver circuits. In certain embodiments, a sum of durations of the different reset control signals is not greater than a duration of the set control signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
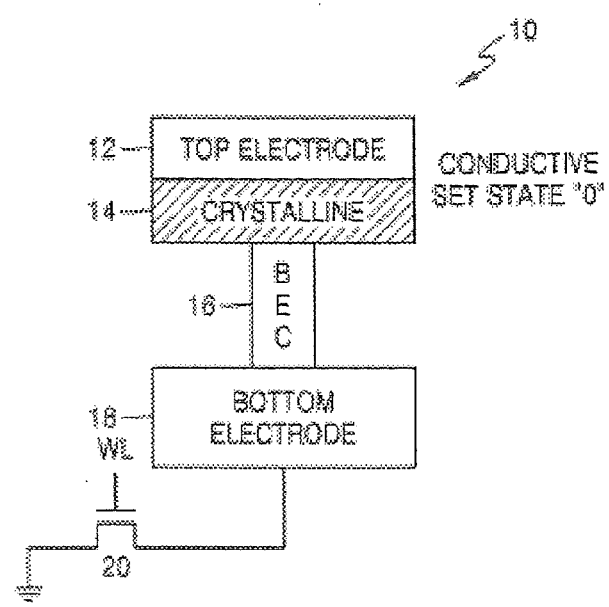
FIGS. 1A and 1B are illustrations of a phase change memory cell.
Figure 1B:
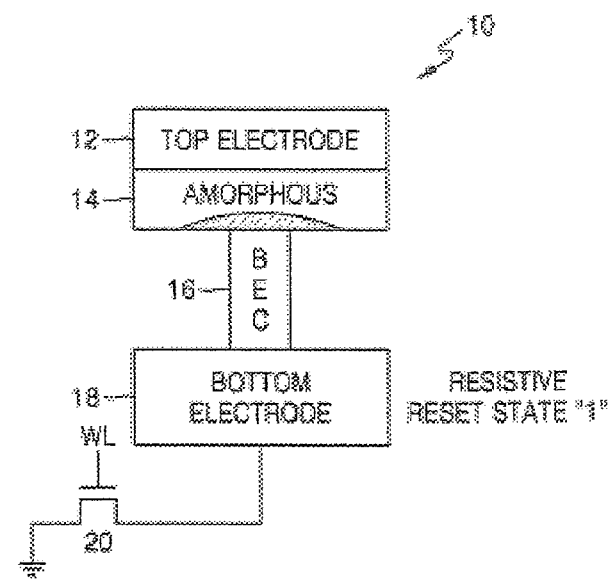
Figure 2:
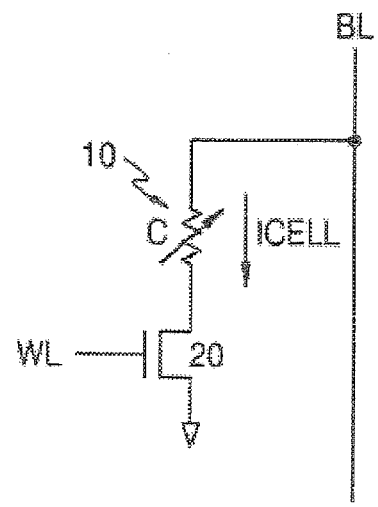
FIG. 2 is a schematic diagram of a phase change memory cell.
Figure 3:
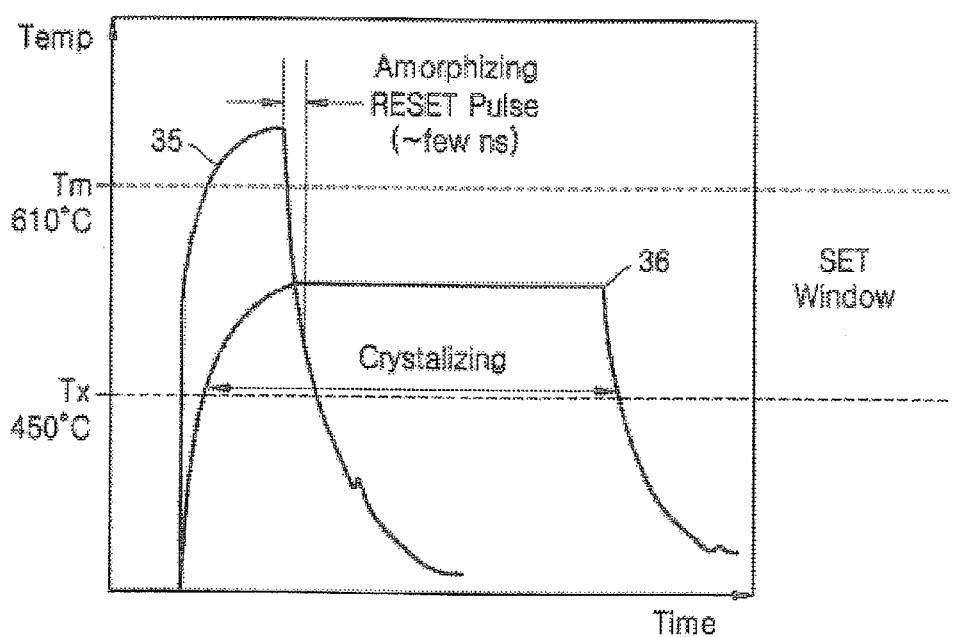
FIG. 3 is graph illustrating the change in state of a phase change material as a function of time and temperature.
Figure 4:
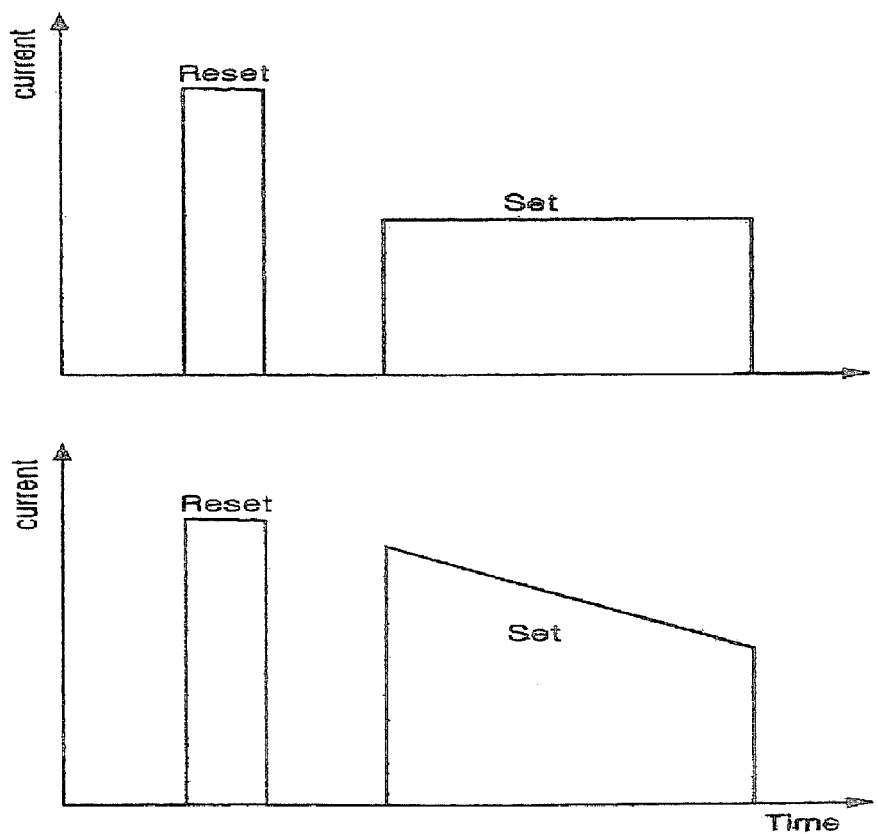
FIG. 4 is a graph illustrating different set and reset pulses for phase change memories.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

Some embodiments of the present invention provide for sequentially providing reset pulses to phase change memory cells so as to reduce the peak current required to program the memory cells from that required if the memory cells are reset simultaneously.

Figure 5:
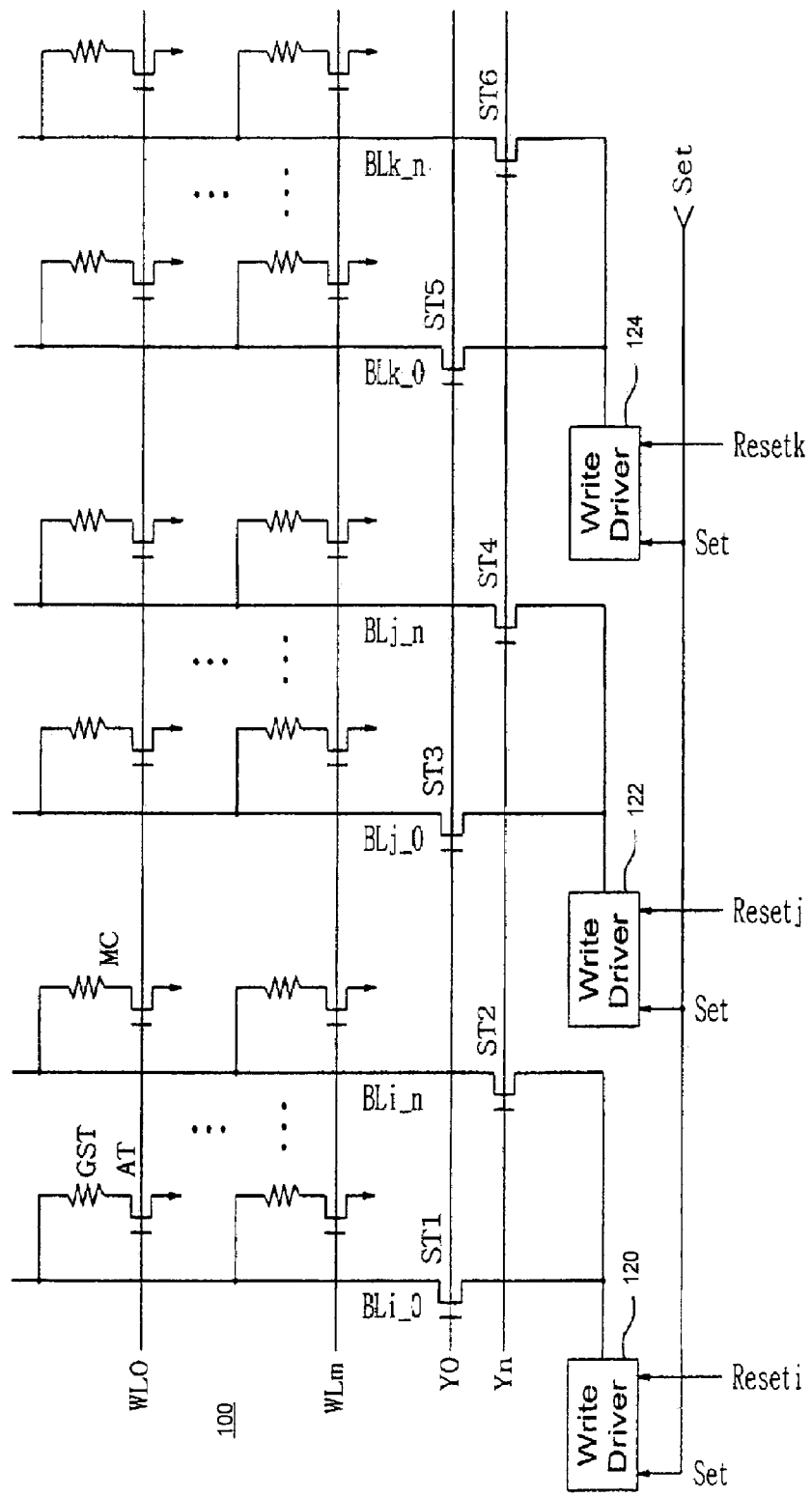
FIG. 5 is a block diagram of a portion of a phase change memory according to some embodiments of the present invention.

FIG. 5 is a schematic diagram of a phase change memory device 100 configured to provide sequential reset pulses according to some embodiments of the present invention. As seen in FIG. 5, the phase change memory device 100 includes a plurality of phase change memory cells MC that include an access transistor AT and a variable resistance that includes a phase change material GST. The access transistors AT are connected to respective word lines WL0 through WLm to control turning the access transistors AT on and off. The memory cells are also connected to respective bit lines BLi_0 . . . BLi_n, BLj_0 . . . BLj_n and BLk_0 . . . BLk_n. Respective select transistors ST1, ST2, ST3, ST4, ST5 and ST6 are also provided to selectively couple the bit lines to a corresponding one of a plurality of write driver circuits 120, 122 and 124.

The word lines may be responsive to a row address decoder (not shown) and the bit lines may be selected responsive to a column address decoder (not shown). Such row and address decoders are well known in the art and need not be described further herein. As used herein, a word of data refers to the number of bits that are selected for a given output of the row address decoder and column address decoder (i.e. when a word line is active and a corresponding column select signal is active). In some embodiments of the present invention, a word includes 16 bits of data.

Furthermore, as illustrated in FIG. 5, a write driver may be coupled to multiple bit lines. The multiple bit lines may be from different words of data. In other embodiments, the some or all of the bit lines coupled to a write driver may be from the same word of data. As illustrated in FIG. 5, however, the bit lines coupled to the respective write drivers 120, 122 and 124 are from different words of data. Thus, in the embodiments illustrated in FIG. 5, the bit lines BLi_0 through BLi_n represent the ith bit of n words of data. In some embodiments of the present invention, four bit lines are coupled to each of the write drivers 120, 122 and 124.

Figure 6:
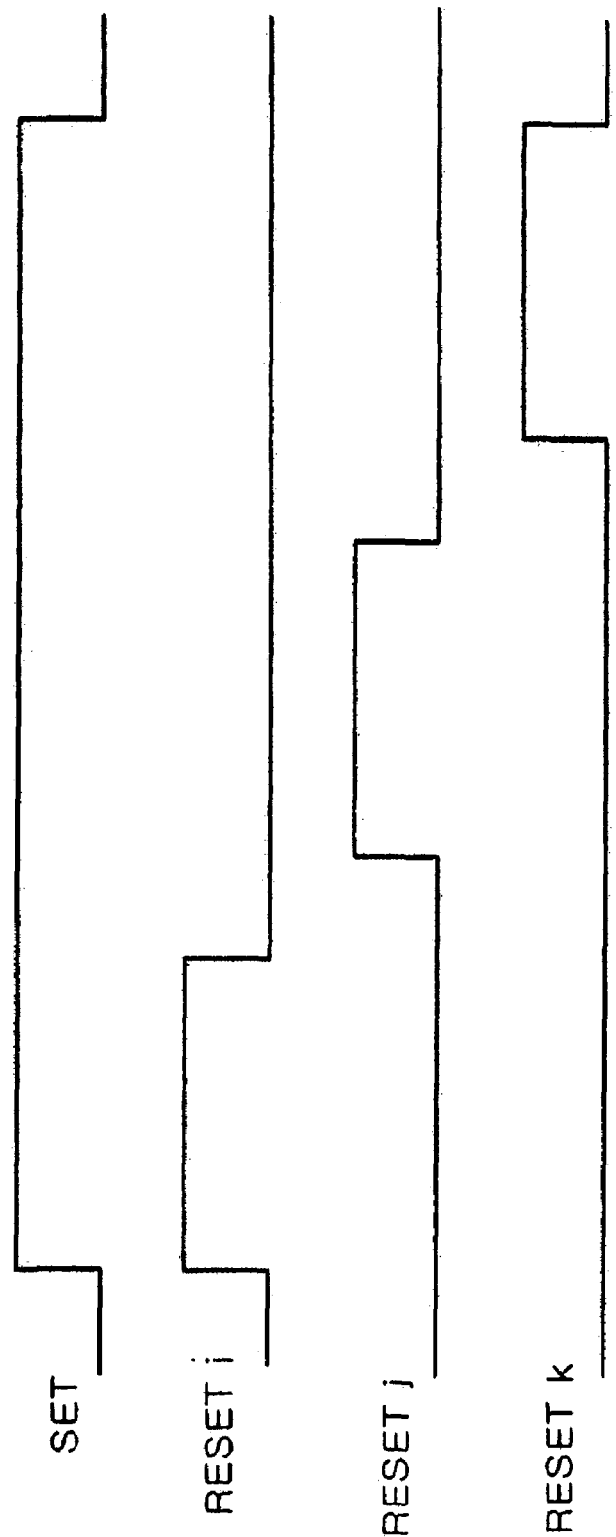
FIG. 6 is a timing diagram illustrating the timing of set and reset signals of the phase change memory of FIG. 5 according to some embodiments of the present invention.

As is further illustrated in FIG. 5, the plurality of write drivers 120, 122 and 124 each receive a common set signal and individual reset signals RESET i, RESET j and RESET k. As is illustrated in FIG. 6, the set signal Set may be a signal with a relatively long duration and the respective reset signals RESET i, RESET j and RESET k each have a shorter duration and are sequenced in time. The reset signals RESET i, RESET j and RESET k are provided as sequential reset pulses by a reset signal generator. Examples of a reset signal generator are discussed in further detail below. Thus, the reset signals RESET i, RESET j and RESET k may be sequentially applied to the write drivers 120, 122 and 124 such that fewer than all of the write drivers for a word of data are simultaneously active, which may reduce the peak current requirements when the memory cells are reset.

In some embodiments of the present invention, the set signal Set has a duration of from about 100 to about 500 nanoseconds (ns) and the sequential reset signals RESET i, RESET j and RESET k each have a duration of from about 10 to about 50 ns. The sequential reset signals are non-overlapping and, in some embodiments, may be spaced apart from each other by about 10 ns. In some embodiments of the present invention, the sum of the durations of the sequential reset signals is less than the duration of the set signal. By making the sum of the durations of the reset signals not greater than the duration of the set signal, the peak reset current may be reduced without extending the time it takes to program a word of data of the phase change memory device. Furthermore, while three reset signals are illustrated in FIGS. 5 and 6, fewer or greater numbers of reset signals may be provided. In some embodiments of the present invention, the number of reset signals is limited to the number of reset signals that may be provided without having the sum of the durations of the reset signals exceed the duration of the set signal.

While the embodiments illustrated in FIG. 5 show three write drivers 120, 122 and 124, such an illustration is merely an example configuration of a portion of a phase change memory device and fewer or greater numbers of write drivers may be provided. Furthermore, while FIG. 5 illustrates individual write drivers each having a separate reset signal, according to some embodiments of the present invention, groups of write drivers may receive the same signal, so long as the groups contain fewer than all of the write drivers for a word of data. Thus, for example, two or more write drivers in the same word of data may each receive the same reset signal. The groups of write drivers that receive the same reset signal may be uniform in number or non-uniform. For example, in some embodiments of the present invention, four sequential reset signals may be provided, each to four write drivers such that a 16 bit word of data is divided across four groups of write drivers.

Figure 7:
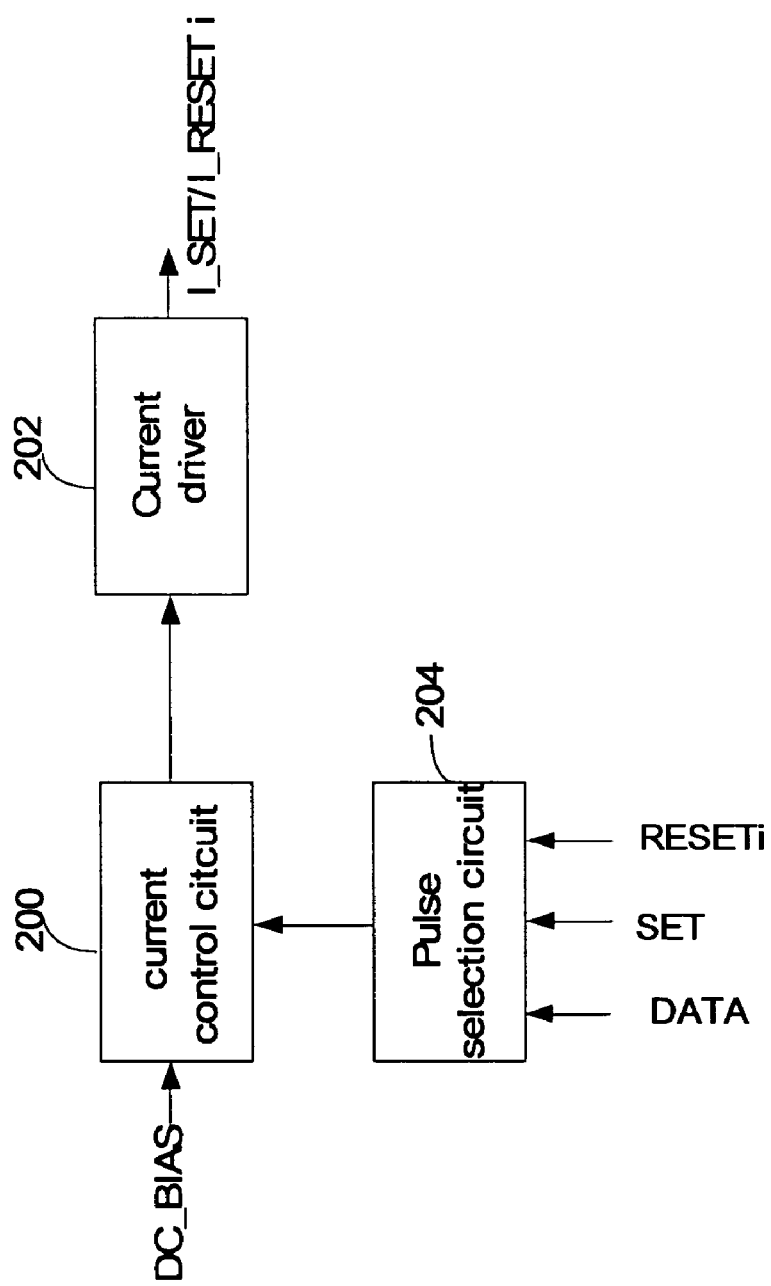
FIG. 7 is a block diagram of a write driver circuit according to some embodiments of the present invention.

FIG. 7 is a diagram of a write driver circuit according to some embodiments of the present invention that may be suitable for use as the write drivers 120, 122 and/or 124. As seen in FIG. 7, a write driver circuit according to some embodiments of the present invention include a current control circuit 200, a current driver circuit 202 and a pulse selection circuit 204. A bias voltage DC_BIAS is provided to the current control circuit 200. The current control circuit 200 is responsive to the pulse selection circuit 204 and controls the current driver 202 to output either a set or a reset pulse. The pulse selection circuit 204 receives a set pulse and one of the sequential reset pulses as illustrated in FIG. 6 and the data to be programmed in the phase change memory cell and uses the data to select one of the set pulse and the sequential reset pulse. The selected one of the set pulse and the sequential reset pulse controls the current control circuit and the current driver to drive the bit line at the time and for the duration substantially corresponding to the timing of the selected one of the set pulse and the sequential reset pulse.

Figure 8:
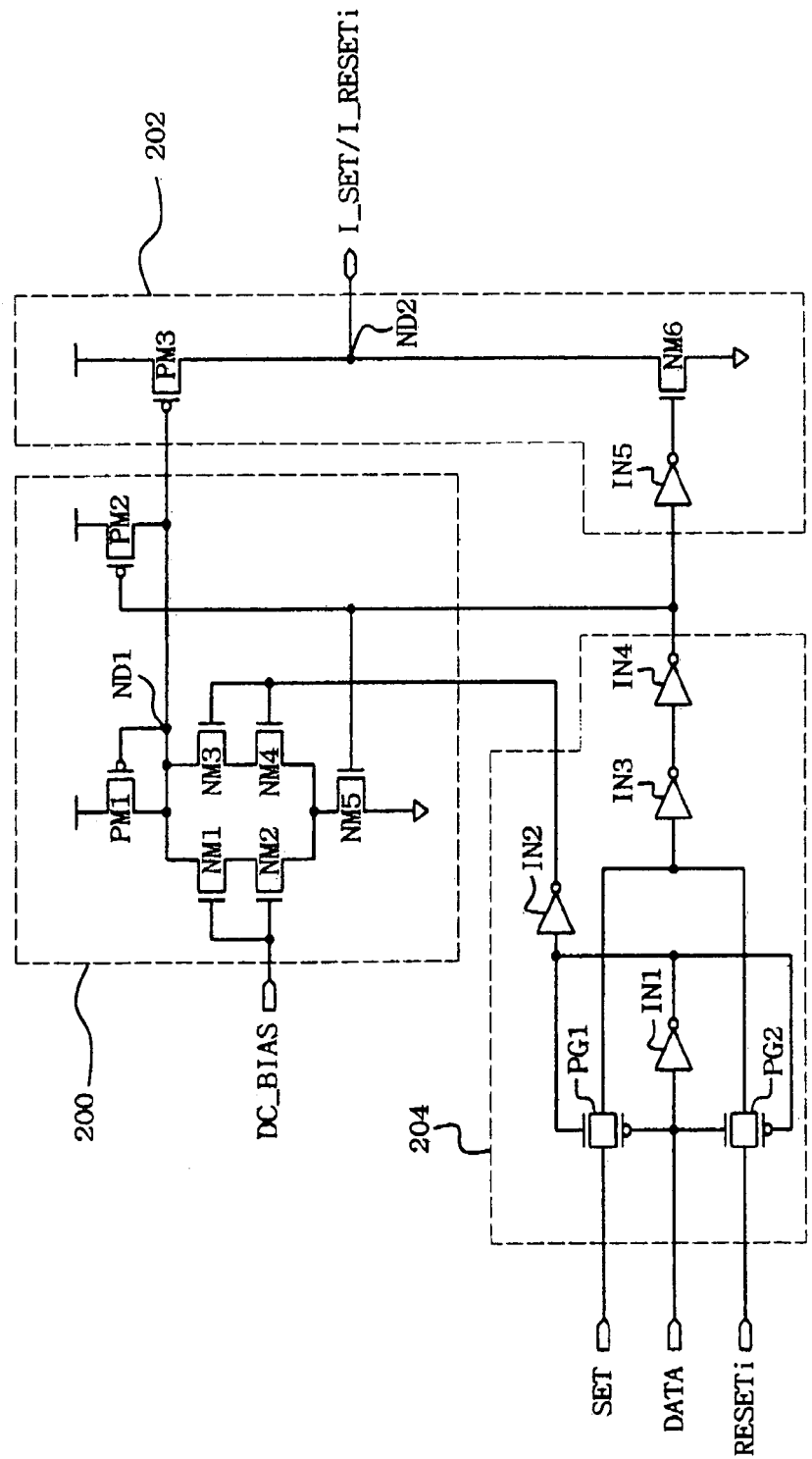
FIG. 8 is a schematic circuit diagram of the write driver of FIG. 7 according to some embodiments of the present invention.

FIG. 8 is a more detailed schematic diagram of the write driver circuit of FIG. 7 according to some embodiments of the present invention. As seen in FIG. 8, the DATA input selects between the SET and RESETi inputs and provides a signal corresponding to the selected one of the SET and RESETi inputs to the current control circuit 200. The current control circuit 200 controls the current supplied by the current driver circuit 202 by controlling the drive transistor PM3.

The duration of the output pulse I_SET/I_RESETi is controlled by the output of the inverter IN4 such that, when the output of the inverter IN4 is at a high level, the transistors NM6 and PM2 are off and the control of the drive transistor PM3 is based on the voltage of the node ND1 of the current control circuit 200. When the output of the inverter IN4 is at a low level, the transistor PM2 turns on, which turns off the drive transistor PM3. When the output of the inverter IN4 is at a low level, the output of the inverter IN5 is at a high level, which turns on the transistor NM6 and terminates the set/reset pulse I_SET/I_RESETi being at a high level. The output of the inverter IN4 is controlled by the selected one of the SET and RESETi inputs through the inverter IN3. Thus, the duration of the set/reset pulse I_SET/ I_RESETi applied to a bit line by the write driver circuit may be controlled by the pulse duration of the selected one of the SET and RESETi inputs.

When the DATA input is at a high level so as to select the RESETi input through the pass gate PG2, the output of the inverter IN1 is low and the output of the inverter IN2 is high. Thus, the transistors NM3 and NM4 are turned on. The transistors NM1 and NM2 are always on as a result of being controlled by the DC_BIAS input. When the RESETi signal is at a high level, the output of the inverter IN4 is at a high level which turns on the transistor NM5 and turns off the transistor PM2. Currents of i1 flowing through the transistors NM1 and NM2 and i2 flowing through the transistors NM3 and NM4 are mirrored, so that a reset current of i1+i2 is provided at the output node ND2. When the reset signal RESETi returns to a low level, the transistors PM3 is turned off and the transistor NM6 is turned on to terminate the reset pulse as described above.

When the DATA input is at a low level so as to select the SET input through the pass gate PG1, the output of the inverter IN1 is high and the output of the inverter IN2 is low. Thus, the transistors NM3 and NM4 are turned off. The transistors NM1 and NM2 are always on as a result of being controlled by the DC_BIAS input. When the SET signal is at a high level, the output of the inverter IN4 is at a high level which turns on the transistor NM5 and turns off the transistor PM2. Only the current i1 flowing through the transistors NM1 and NM2 is mirrored, so that a set current of i1 is provided at the output node ND2. When the set signal SET returns to a low level, the transistors PM3 is turned off and the transistor NM6 is turned on to terminate the set pulse as described above.

Figure 9:
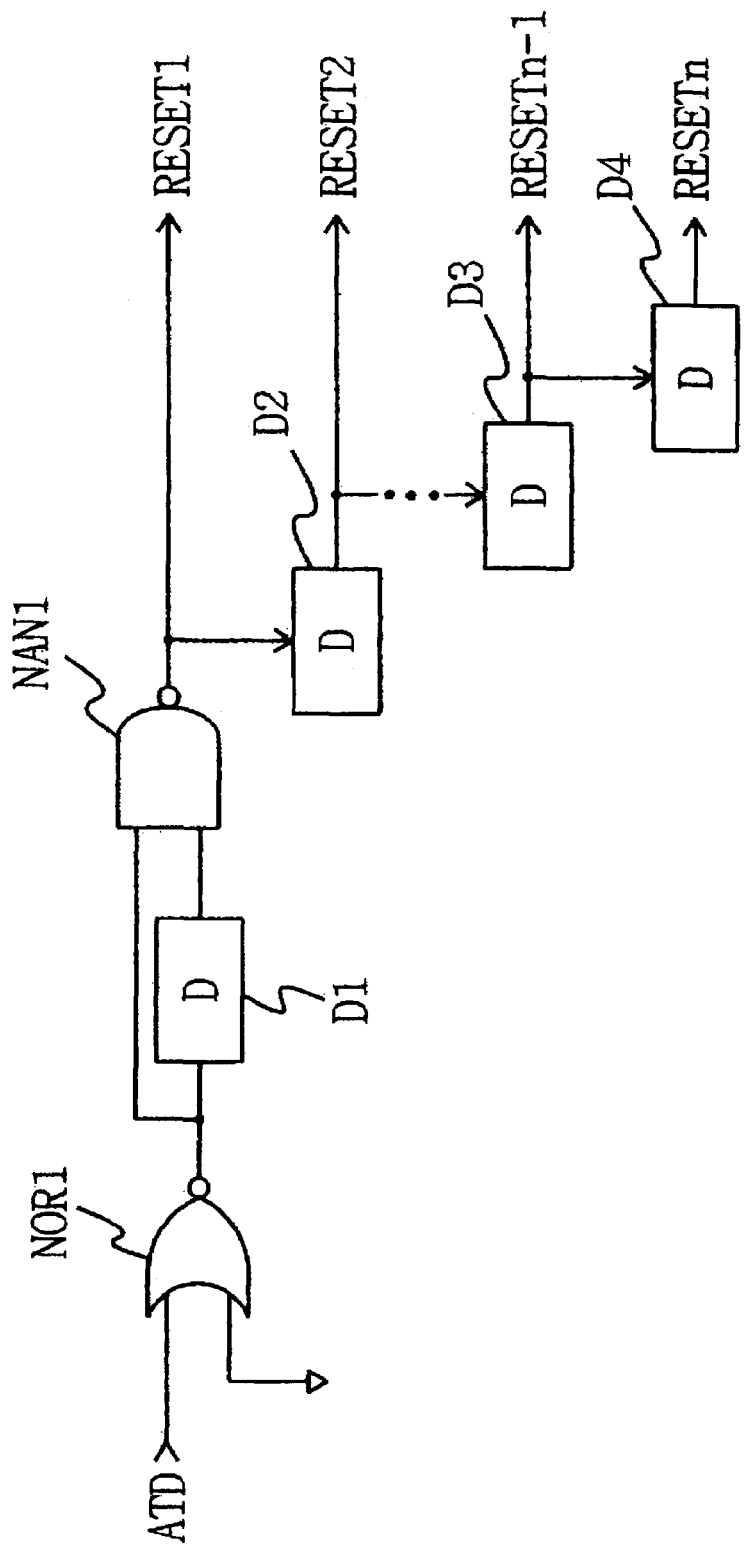
FIG. 9 is a circuit diagram of a reset control signal generator according to some embodiments of the present invention.

FIG. 9 is a schematic diagram of a reset signal generation circuit according to some embodiments of the present invention. As seen in FIG. 9, the reset pulse may be generated responsive to an address transition detection signal (ATD). In other embodiments of the present invention, the reset pulse may be generated responsive to a data transition detection signal (DTD). The ATD signal is provided to a NOR gate NOR1 that acts as an inverter such that when the ATD signal is high, the output of the of the NOR gate NOR1 is low and when the ATD signal is low, the output of the of the NOR gate NOR1 is high. The output of the NOR gate NOR1 is coupled to the input of a NAND gate NAN1 and to a delay element D1. The delay element D1 may be used to control the duration of the sequential reset pulses. Thus, the delay element D1, in some embodiments of the present invention, provides a pulse of from about 10 to about 50 ns. The output of the NAND gate NAN1 is provided to a plurality of serially connected delay elements D2, D3 and D4 where the output of the delay elements is provided as a subsequent one of the plurality of sequential reset pulses. In some embodiments of the present invention, the delay elements D2, D3 and D4 have a delay that is greater than the duration of the pulse output by the NAND gate NAN1 so as to provide non-overlapping sequential pulses. In some embodiments, the delay of the delay elements D2, D3 and D4 is greater than the duration of the pulse output by the NAND gate NAN1 by about 10 ns.

Figure 10:
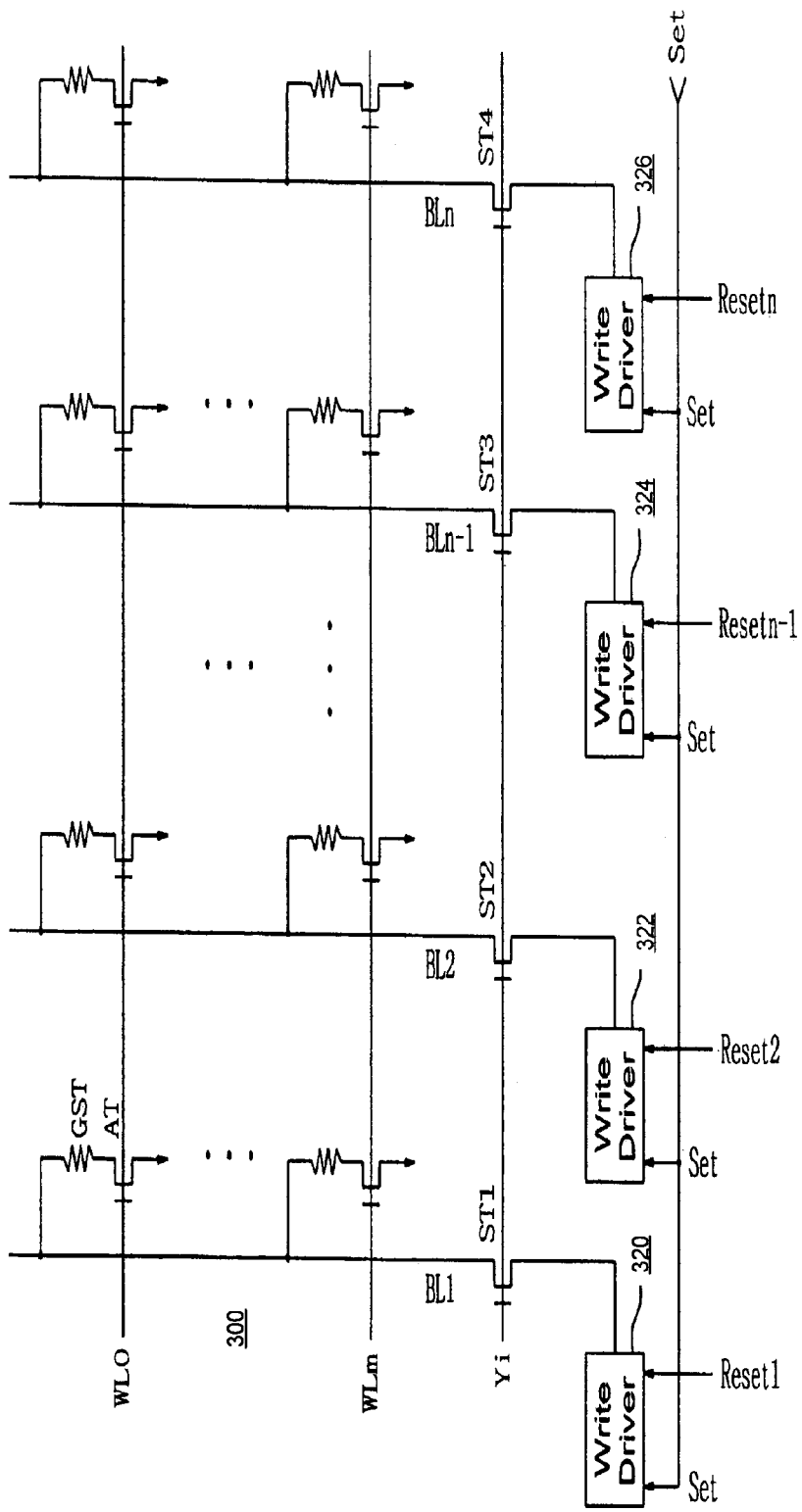
FIG. 10 is a block diagram of a portion of a phase change memory according to further embodiments of the present invention.
Figure 11:
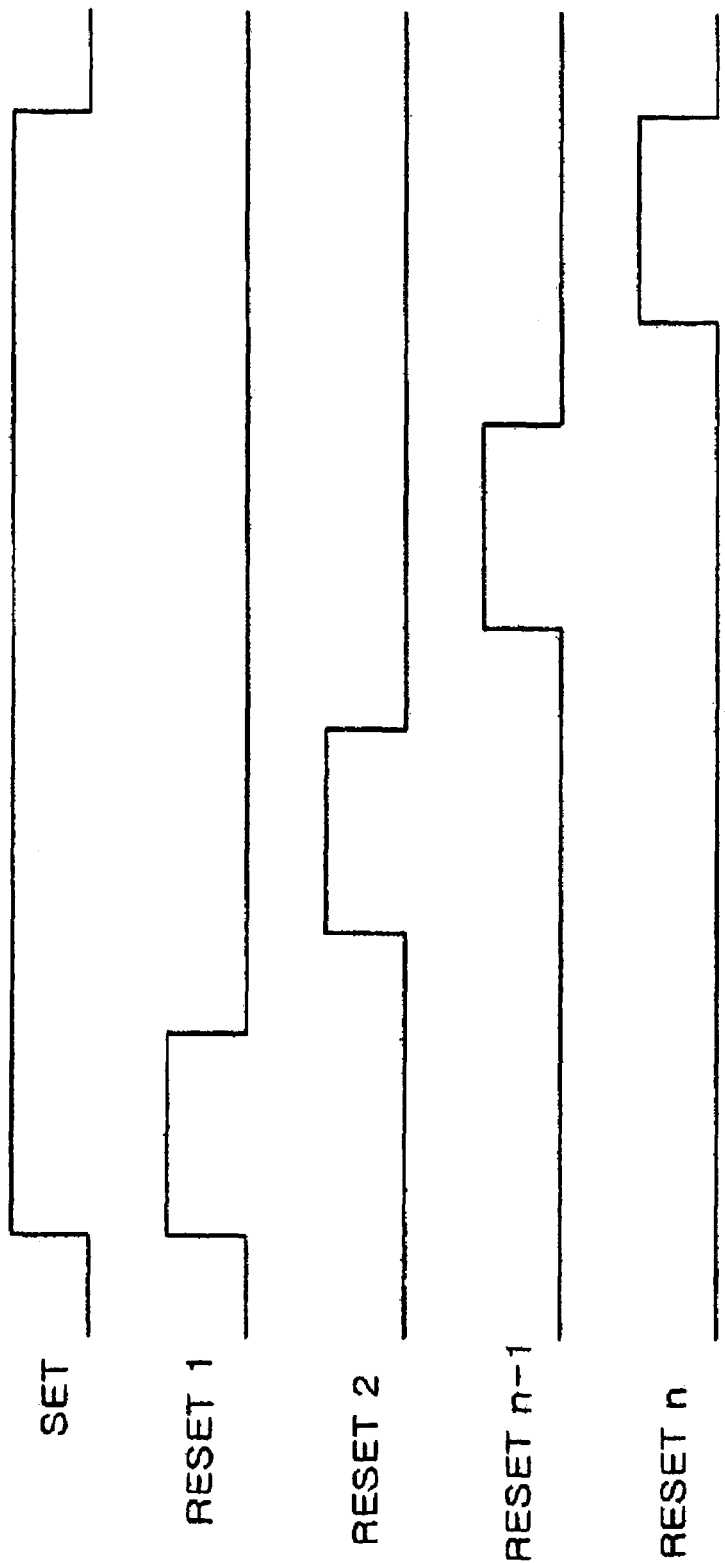
FIG. 11 is a timing diagram illustrating the timing of set and reset signals of the phase change memory of FIG. 10 according to some embodiments of the present invention.

FIG. 10 is a schematic diagram of a portion of a phase change memory device 300 according to further embodiments of the present invention. As seen in FIG. 10, the phase change memory cells may be provided as described above with reference to FIG. 5. However, the write driver circuits 320, 322, 324 and 326 are each connected to a single bit line. In such a case, the reset RESET1 . . . RESETn and set Set signals may be provided as illustrated in FIG. 11. The write driver circuits 320, 322, 324 and 326 may be provided as described above with reference to FIGS. 7 and 8. Furthermore, the reset pulse generation circuit of FIG. 9 may be utilized to provide sequential reset pulses to each of the individually connected write driver circuits 320, 322, 324 and 326. The durations and relationship of the reset pulses and the set pulse may be as described above with reference to FIGS. 5 and 6.

In operation, the phase change memory device 300 of FIG. 10 may provide sequential reset pulses to the respective write driver circuits 320, 322, 324 and 326. Because the reset pulses are sequentially applied to the write driver circuits 320, 322, 324 and 326, the peak current required for resetting phase change memory cells may be reduced as the number of write driver circuits 320, 322, 324 and 326 that are simultaneously driving the bit lines may be reduced.

As described above, some embodiments of the present invention may provide phase-change memory devices that include a plurality of phase-change memory cells and means for sequentially applying a reset pulse to subsets of the phase-change memory cells that are commonly connected to a word line. The means for sequentially applying a reset pulse may be provided, for example by the write driver circuits 120, 122 and 124 and/or 320, 322, 324 and 326, pulse generation circuits of FIG. 9 and interconnection of the write driver circuits to the phase change memory cells as described above with reference to FIGS. 5 and/or 10. In particular embodiments of the present invention, the plurality of phase-change memory cells are reset by applying a signal of a first pulse width to the phase-change memory cells and set by applying a signal of a second pulse width to the phase-change memory cells. In such a case, the means for sequentially applying a reset pulse may comprise means for sequentially applying a reset pulse wherein a duration of each of the sequentially applied reset pulses corresponds to the first pulse width and a sum of the durations of the sequentially applied reset pulses is not substantially greater than the second pulse width. Thus, the peak current may be reduced without increasing the programming timing for writing a word of data. Such means for sequentially applying a reset pulse may be provided by the configuration of the delay lines or other such pulse generation circuits that provided the appropriate timing relationships.

Furthermore, some embodiments of the present invention may provide means for applying a common set pulse to the subsets of the phase-change memory cells that are commonly connected to a word line. Such means may be provided, for example, by the interconnection of a set pulse generation circuit to the write driver circuits as discussed above.

While embodiments of the present invention have been described with reference to particular exemplary write driver circuits and/or reset pulse generation circuits, other techniques and/or circuits for providing sequentially applied reset pulses may be utilized. For example, pulse generation circuits that do not use delay lines may be utilized or any circuit that provides the desired sequential pulses with the appropriate timing relationship. Furthermore, the pulse width and sequential application of reset pulses to the bit lines could be accomplished outside the write driver circuits, for example, by serially activating the access transistors ST1, ST3 and ST5 while providing a common reset signal to the write driver circuits and controlling the reset pulse duration by controlling the duration of time that the access transistors are active.

Embodiments of the present invention have been described with reference to particular divisions of functions between, for example, a write driver circuit and a pulse generation circuit or functions within the write driver circuits. However, blocks in the diagrams may be combined or otherwise rearranged while still falling within the scope of the present invention. Accordingly, embodiments of the present invention are not limited to the particular illustrative examples discussed above but may include any circuit capable of carrying out the functions or operations described herein for sequentially providing reset pulses to phase change memory cells.

While the present invention has been particularly shown and described with reference to illustrative embodiments thereof, it will be understood by those of ordinary skill in the art that various changes in form and details may be made therein without departing from the spirit and scope of the present invention as defined by the following claims.

What is claimed is:

1. A phase-change memory device, comprising:
a plurality of phase-change memory cells;
a reset pulse generation circuit configured to output a plurality of sequential reset pulses, each sequential reset pulse being output to a corresponding one of a plurality of reset lines; and
a plurality of write driver circuits coupled to corresponding phase change memory cells and to a corresponding one of the reset lines of the reset pulse generation circuit.

2. The phase-change memory device of claim 1, wherein the plurality of write driver circuits are coupled to corresponding phase change memory cells corresponding to a word of data.

3. The phase-change memory device of claim 1, wherein the reset pulse generation circuit comprises:
a first pulse generation circuit configured to generate a first reset pulse; and
a plurality of delay lines serially coupled to the first pulse generation circuit to provide successive sequentially delayed reset pulses.

4. The phase-change memory device of claim 3, wherein the first pulse generation circuit is responsive to an address transition detection signal to generate the first reset pulse.

5. The phase-change memory device of claim 3, wherein the first pulse generation circuit is responsive to a data transition detection signal to generate the first reset pulse.

6. The phase-change memory device of claim 3, wherein the first pulse generation circuit comprises a NAND logic gate having a first control signal as a first input and a delayed version of the first control signal as a second input.

7. The phase-change memory device of claim 6, wherein the first pulse generation circuit further comprises a delay line that receives as an input the first control signal and outputs the delayed version of the first control signal to the second input of the NAND logic gate.

8. The phase-change memory device of claim 3, wherein a delay of each of the delay lines is greater than a pulse width of the first reset pulse.

9. The phase-change memory device of claim 1, wherein the plurality of write driver circuits are each coupled to a plurality of bit lines of the phase-change memory cells.

10. The phase-change memory device of claim 9, wherein the plurality of bit lines are from a same word of the phase-change memory device.

11. The phase-change memory device of claim 9, wherein the plurality of bit lines are from different words of the phase-change memory device.

12. The phase-change memory device of claim 1, wherein the plurality of write driver circuits are each coupled to a single bit line of the phase-change memory cells.

13. The phase-change memory device of claim 1, wherein a sum of a duration of each of the plurality of sequential reset pulses is less than a duration of a set pulse of the phase-change memory device.

14. The phase-change memory device of claim 1, wherein a set pulse of the phase-change memory device has a duration of from about 100 to about 500 ns and each of the sequential reset pulses has a duration of from about 10 to about 50 ns.

15. The phase-change memory device of claim 1, wherein the sequential reset pulses are spaced apart from each other by about 10 ns.

16. A method of programming a memory device comprising a plurality of phase-change memory cells, comprising sequentially applying a reset pulse to subsets of the phase-change memory cells that are commonly connected to a word line, wherein the sequentially applied reset pulses are generated by respective write drivers responsive to corresponding reset control signals and wherein each of the write drivers receives a same set control signal.

17. The method of claim 16 wherein the subsets of the phase-change memory cells are configured so that a different reset pulse is applied to each individual bit line of the memory device.

18. The method of claim 16, wherein the subsets of the phase-change memory cells are configured so that a same reset pulse is applied to at least two different bit lines of the memory device.

19. The method of claim 18, wherein the at least two different bit lines are each from different words of the memory device.

20. The method of claim 16, wherein the sequentially applied reset pulses are not overlapping.

21. The method of claim 16, wherein a set pulse of the phase-change memory device has a duration of from about 100 to about 500 ns and each of the sequential reset pulses has a duration of from about 10 to about 50 ns.

22. The method of claim 16, wherein the sequential reset pulses are spaced apart from each other by about 10 ns.

23. A method of programming a memory device comprising a plurality of phase-change memory cells, comprising sequentially applying a reset pulse to subsets of the phase-change memory cells that are commonly connected to a word line, wherein the plurality of phase-change memory cells are reset by applying a signal of a first pulse width to the phase-change memory cells and set by applying a signal of a second pulse width to the phase-change memory cells and wherein a duration of each of the sequentially applied reset pulses corresponds to the first pulse width and a sum of the durations of the sequentially applied reset pulses is not greater than the second pulse width.

24. A phase-change memory device comprising:
a plurality of phase-change memory cells; and
means for sequentially applying a reset pulse to subsets of the phase-change memory cells that are commonly connected to a word line,
wherein the plurality of phase-change memory cells are reset by applying a signal of a first pulse width to the phase-change memory cells and set by applying a signal of a second pulse width to the phase-change memory cells and wherein the means for sequentially applying a reset pulse comprises means for sequentially applying a reset pulse wherein a duration of each of the sequentially applied reset pulses corresponds to the first pulse width and a sum of the durations of the sequentially applied reset pulses is not substantially greater than the second pulse width.

25. The phase-change memory device of claim 24, wherein the subsets of the phase-change memory cells are configured so that a different reset pulse is applied to each individual bit line of the memory device.

26. The phase-change memory device of claim 24, wherein the subsets of the phase-change memory cells are configured so that a same reset pulse is applied to at least two different bit lines of the memory device.

27. The phase-change memory device of claim 26, wherein the at least two different bit lines are each from different words of the memory device.

28. The phase-change memory device of claim 24, further comprising means for applying a common set pulse to the subsets of the phase-change memory cells that are commonly connected to a word line.

29. A phase-change memory device, comprising:
a plurality of phase-change memory cells; and
a plurality of write driver circuits coupled to the phase change memory cells wherein each of the plurality of write driver circuits receives a different, non-overlapping, reset control signal, wherein each of the write driver circuits also receives a same set control signal, and wherein a sum of durations of the different reset control signals is not greater than a duration of the set control signal.

30. A method of controlling write driver circuits of a phase-change memory device, comprising providing a different, non-overlapping, reset control signal to each of a plurality of write driver circuits of the phase-change memory device, wherein a sum of durations of the different reset control signals is not greater than a duration of the set control signal.

31. The method of claim 30, further comprising providing a same set control signal to each of the plurality of write driver circuits.

* * * * *